US008076721B2

(12) United States Patent  (10) Patent No.: US 8,076,721 B2
Tang et al.  (45) Date of Patent: Dec. 13, 2011

(54) FIN STRUCTURES AND METHODS OF FABRICATING FIN STRUCTURES

(75) Inventors: Sahn D. Tang, Boise, ID (US); Gordon Haller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/795,495

(22) Filed: Jun. 7, 2010

(65) Prior Publication Data

US 2010/0252886 A1  Oct. 7, 2010

Related U.S. Application Data

(63) Continuation of application No. 11/508,047, filed on Aug. 22, 2006, now Pat. No. 7,745,319.

(51) Int. Cl.
H01L 29/78 (2006.01)
(52) U.S. Cl. . 257/330; 257/332; 257/622; 257/E29.135; 257/E29.255
(58) Field of Classification Search .................. 257/331, 257/E29.135, E29.264
See application file for complete search history.

(56) References Cited

U.S. PATENT DOCUMENTS

| | | | |
|---|---|---|---|
| 5,021,353 A | 6/1991 | Lowrey et al. | |
| 5,177,027 A | 1/1993 | Lowrey et al. | |
| 5,804,506 A | 9/1998 | Haller et al. | |
| 6,060,783 A | 5/2000 | Juengling et al. | |
| 6,110,798 A | 8/2000 | Gonzalez et al. | |
| 6,346,455 B1 | 2/2002 | Thakur et al. | |
| 6,376,380 B1 | 4/2002 | Tang et al. | |
| 6,469,389 B2 | 10/2002 | Juengling et al. | |
| 6,492,212 B1 | 12/2002 | Ieong et al. | |
| 6,794,720 B2 | 9/2004 | Yagishita et al. | |
| 6,903,425 B2 | 6/2005 | Tang et al. | |
| 6,936,507 B2 | 8/2005 | Tang et al. | |
| 6,963,104 B2 | 11/2005 | Wu et al. | |
| 7,071,043 B2 | 7/2006 | Tang et al. | |
| 7,071,049 B2 | 7/2006 | Tang et al. | |
| 7,084,461 B2 | 8/2006 | Anderson | |
| 7,091,566 B2 | 8/2006 | Zhu et al. | |
| 7,122,425 B2 | 10/2006 | Chance et al. | |
| 7,199,419 B2 | 4/2007 | Haller | |
| 7,241,655 B2 | 7/2007 | Tang et al. | |
| 7,242,057 B2 | 7/2007 | Tang et al. | |
| 7,265,059 B2 | 9/2007 | Rao et al. | |
| 7,271,413 B2 | 9/2007 | Chance et al. | |
| 7,279,774 B2 | 10/2007 | Seo et al. | |
| 7,285,812 B2 | 10/2007 | Tang et al. | |
| 7,323,404 B2 | 1/2008 | Lee | |

(Continued)

OTHER PUBLICATIONS

F. Fishburn, B. Busch, J. Dale, D. Hwang, R. Lane, T. McDaniel, S. Southwick, R. Turi, H. Wang, and L. Tran, A 78nm 6F2 DRAM Technology for Multigigabit Densities, Micron Technology, Inc.—Process R&D Center, Boise, Idaho.

(Continued)

Primary Examiner — Mary Wilczewski
Assistant Examiner — Toniae Thomas
(74) Attorney, Agent, or Firm — Fletcher Yoder

(57) ABSTRACT

There is provided fin structures and methods for fabricating fin structures. More specifically, fin structures are formed in a substrate. The fin structures may include two fins separated by a channel, wherein the fins may be employed as fins of a field effect transistor. The fin structures are formed below the upper surface of the substrate, and may be formed without utilizing a photolithographic mask to etch the fins.

12 Claims, 8 Drawing Sheets

U.S. PATENT DOCUMENTS

| | | |
|---|---|---|
| 7,473,611 B2 | 1/2009 | Cho et al. |
| 7,547,945 B2 | 6/2009 | Tang |
| 2004/0191980 A1 | 9/2004 | Rios et al. |
| 2005/0035391 A1 | 2/2005 | Lee et al. |
| 2005/0179030 A1* | 8/2005 | Seo et al. ............... 257/20 |
| 2005/0285204 A1* | 12/2005 | Kim et al. ............... 257/368 |
| 2006/0151880 A1 | 7/2006 | Tang et al. |
| 2009/0206443 A1* | 8/2009 | Juengling ............... 257/506 |

OTHER PUBLICATIONS

J.C. Sturm and K. Tokunaga, Increased Transconductance in Fully-Depleted Ultra-Thin Silicon-on-Insulator Mosfet's, Department of Electrical Engineering, Princeton University, Princeton, NJ.

Leland Chang, Yang-Kyu Choi, Daewon Ha, Pushkar Ranade, Shiying Xiong, Jeffrey Bokor, Chenming Hu, and Tus-Jae King, Extremely Scaled Silicon Nano-CMOS Devices, IEEE, vol. 91, No. 11, Nov. 2003, pp. 1860-1873.

R. Katsumata, N. Tsuda, J. Idebuchi, M. Kondo, N. Aoki, S. Ito, K. Yahashi, T. Satonaka, M. Morikado, M. Kito, M. Kido, T. Tanaka, H. Aochi and T. Hamaoto, Fin-Array-FET on Bulk Silicon for Sub-100 nm Trench Capacitor DRAM, 2003 Symposium on VLSI Technology Digest of Technical Papers.

T. Park, S. Choi, D.H. Lee, J.R. Yoo, B.C. Lee, J.Y. Kim, C.G. Lee, K.K. Chi, S.H. Hong, S.J. Syun, Y.G. Shin, J.N. Han, I.S. Park, U.I. Chung, J.T. Moon, E. Yoon, and J.H. Lee, Fabrication of Body-Tied Fin FETs (Omega MOSFETs) Using Bulk Si Wafters, 2003 Symposium on VLSI Technology Digest of Technical Papers.

* cited by examiner

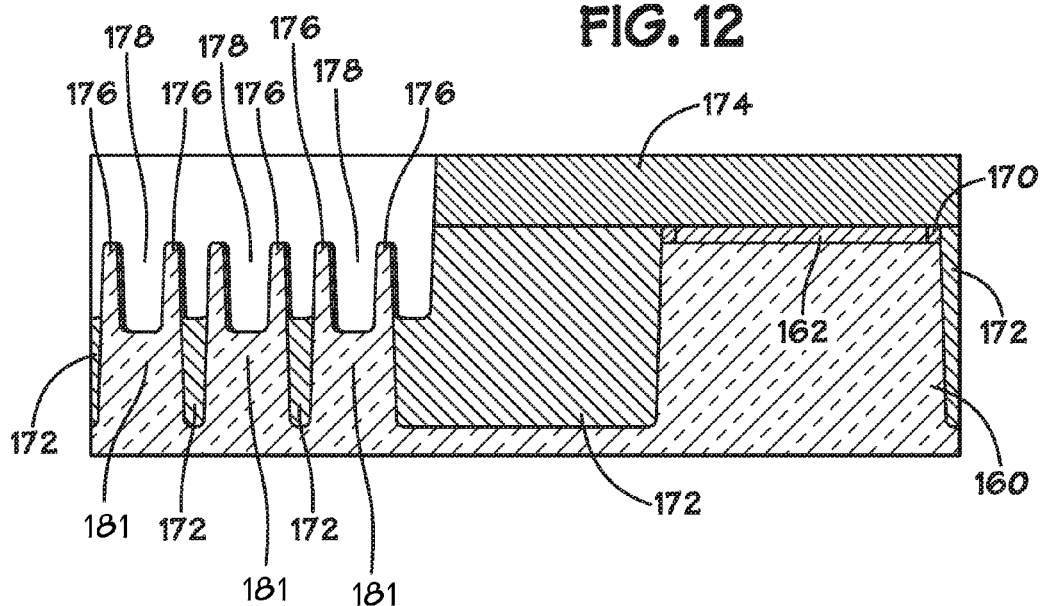
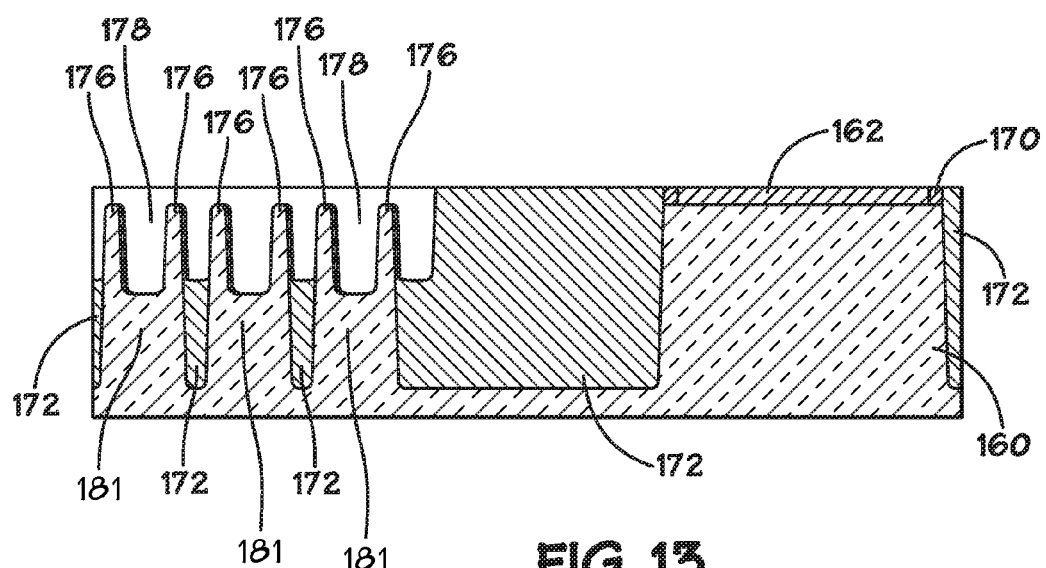

FIN STRUCTURES AND METHODS OF FABRICATING FIN STRUCTURES

CROSS-REFERENCE TO RELATED APPLICATION

This application is a continuation of U.S. patent application Ser. No. 11/508,047, filed on Aug. 22, 2006.

BACKGROUND OF THE INVENTION

1. Field of the Invention

Embodiments of the invention relate relates generally to electronic devices, and, more specifically, to fin field effect transistors ("FETs") and processes for fabricating the same.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Integrated circuits can be found in virtually any electronic device. For example, integrated circuits, such as microprocessors and digital memory chips, are present in products such as computers, cell phones, and microwave ovens. Since their first introduction over a half century ago, integrated circuits have progressively become smaller and increasingly more densely populated. The increase in density provides numerous advantages, including the ability for smaller chips to perform the same functionality as larger chips. Additionally, the smaller size increases performance while reducing power consumption. Specifically, with smaller size, the electrical paths are shorter, allowing lower power logic to be used at fast switching speeds. However, achieving progressively smaller structure size on the chips, and, thus, producing smaller chips, has become increasingly difficult and costly due, at least in part, to reaching physical limitations of standard fabrication techniques. As such, new and improved processes are constantly being proposed to further reduce cost as well as size.

Typically, the integrated circuit manufacturing process includes at least three main processes: 1) patterning; 2) adding materials; and 3) removing materials. The patterning process is primarily achieved by employing a photolithographic mask or other form of mask. Through the patterning process, various regions are defined that eventually serve as the components, such as transistors and traces, of the integrated circuit. The process of adding materials includes depositing or growing material on a substrate to create multiple layers. The process of removing materials generally includes an etching process. It is through the etching process that material in regions defined by the mask is removed to form various structures.

A fin field effect transistor ("fin FET") is a type of metal oxide semiconductor FET ("MOSFET") that is built around a fin (e.g., a tall, thin semiconductive member) extending generally perpendicularly from a substrate. Typically, a gate traverses the fin by conformally running up one side of the fin over the top and down the other side of the fin. Generally, a source and a drain are located on opposite sides of the gate in the fin. In operation, a current through the fin between the source and drain is controlled by selectively energizing the gate.

Advantageously, fin FETs may have significantly faster switching times and higher current density than conventional complementary metal oxide semiconductor ("CMOS") transistors. In addition, those of ordinary skill in the art will appreciate that fin FETs also typically offer greater control over channel voltages and resistance to short-channel effects. Disadvantageously, the number of iterative steps employed to fabricate a fin FET may exceed those of conventional CMOS processes, and in integrated circuit manufacturing, the number of iterative steps in the fabrication process typically correlates directly with the cost of production. As such, reducing the number of steps employed in fabricating a fin FET would be desirable.

BRIEF DESCRIPTION OF THE DRAWINGS

Advantages of the invention may become apparent upon reading the following detailed description and upon reference to the drawings, in which:

FIGS. 6-14 are views further illustrating the manufacturing process of FIGS. 4 and 5 in accordance with the embodiment of the present technique.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming but would nevertheless be a routine undertaking of design, fabrication, and manufacture for those of ordinary skill having the benefit of this disclosure.

Some of the subsequently discussed embodiments may facilitate the manufacture of fin field effect transistors ("FETs"). As is described in detail below, in accordance with one embodiment, there is provided a method of fabricating a transistor comprising a fin and a gate, the method comprising performing a first etch to create a first wall of the fin, wherein a location of the etch is not defined by a photolithographic mask, performing a second etch to create a second wall of the fin, and depositing a gate adjacent to the fin, wherein the gate is deposited after the second etch. As such, the following discussion describes devices and process flows in accordance with embodiments of the present processes. Prior to addressing these embodiments from the device and process flow perspective, exemplary systems in accordance with embodiments of the present technique are described.

Figure 1:
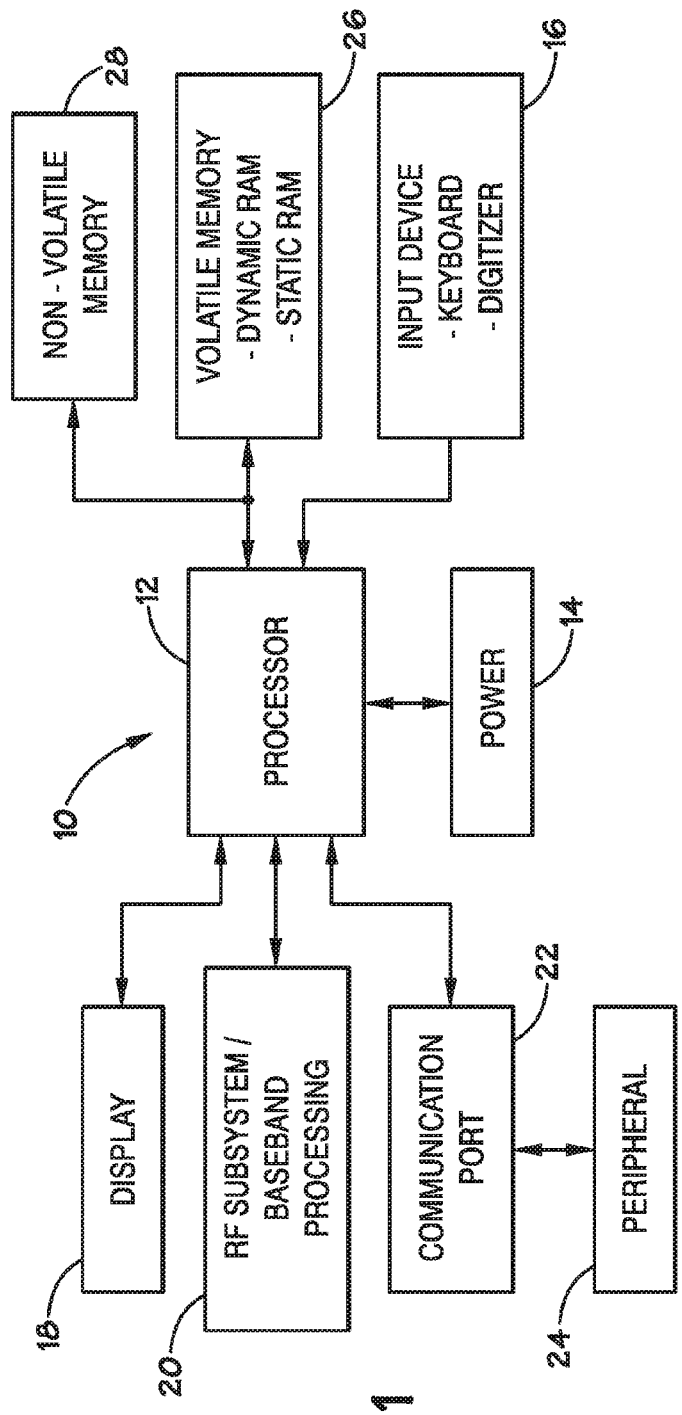
FIG. 1 illustrates a block diagram of a processor-based system in accordance with an embodiment of the present technique.

Turning to the figures, FIG. 1 depicts one embodiment of a processor-based system, generally designated by a reference numeral 10. As is explained below, the system 10 may include various electronic devices manufactured in accordance with embodiments of the present technique. The system 10 may be any of a variety of types such as a computer, pager, cellular phone, personal organizer, control circuit, and so forth. In a typical processor-based system, one or more processors 12, such as a microprocessor, control the processing of system functions and requests in the system 10. The processor 12 and other subcomponents of the system 10 may include structures manufactured in accordance with embodiments of the present technique, as is subsequently explained.

The system 10 typically includes a power supply 14. For instance, if the system 10 is a portable system, the power supply 14 may advantageously include a fuel cell, permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, a digitizer and stylus, and/or a voice recognition system, for instance. A display 18 may also be coupled to the processor 12. The display 18 may include an LCD, an SED display, a CRT display, a DLP display, a plasma display, an OLED display, LEDs, and/or an audio display, for example. Furthermore, an RF sub-system/baseband processor 20 may also be coupled to the processor 12. The RF sub-system/baseband processor 20 may include an antenna that is coupled to an RF receiver and to an RF transmitter (not shown). One or more communication ports 22 may also be coupled to the processor 12. The communication port 22 may be adapted to be coupled to one or more peripheral devices 24 such as a modem, a printer, a computer, or to a network, such as a local area network, remote area network, intranet, or the Internet, for instance.

The processor 12 generally controls the system 10 by implementing software programs stored in the memory. The memory is operably coupled to the processor 12 to store and facilitate execution of various programs. For instance, the processor 12 may be coupled to the volatile memory 26 which may include Dynamic Random Access Memory ("DRAM") and/or Static Random Access Memory ("SRAM"). The volatile memory 26 is typically large so that it can store dynamically loaded applications and data. As described further below, the volatile memory 26 may be configured in accordance with embodiments of the present invention.

The processor 12 may also be coupled to non-volatile memory 28. The non-volatile memory 28 may include a read-only memory ("ROM"), such as an EPROM, and/or flash memory to be used in conjunction with the volatile memory 26. The size of the ROM is typically selected to be just large enough to store any necessary operating system, application programs, and fixed data. Additionally, the non-volatile memory 28 may include a high capacity memory such as a tape or disk drive memory. As is explained in greater detail below, the non-volatile memory 28, as another example, may also include electronic devices manufactured in accordance with embodiments of the present technique.

Figure 2:
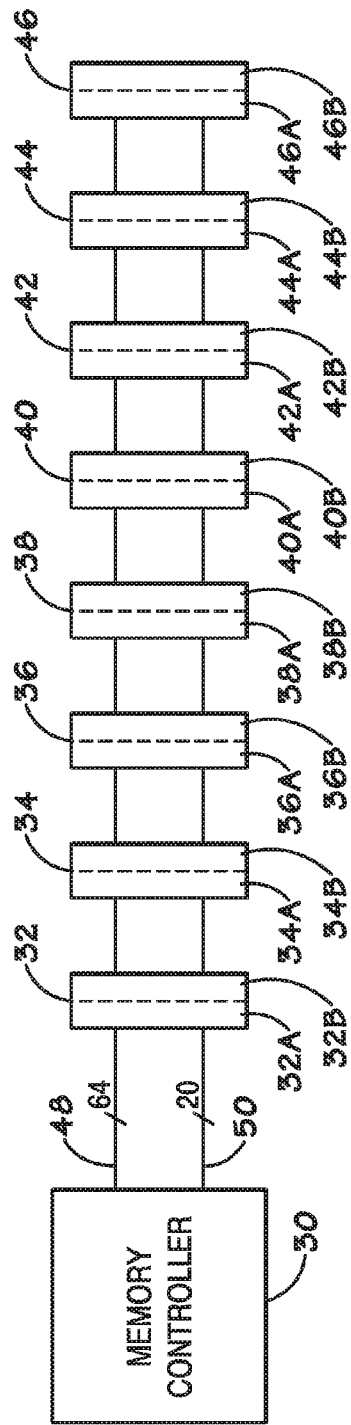
FIG. 2 illustrates a memory sub-system in accordance with an embodiment of the present technique.

FIG. 2 generally illustrates a block diagram of one embodiment of a portion of a memory sub-system, such as the volatile memory 26. A memory controller 30 is generally provided to facilitate access to storage devices in the volatile memory 26. The memory controller 30 may receive requests to access the storage devices via one or more processors, such as the processor 12, via peripheral devices, such as the peripheral device 24, and/or via other systems (not shown). The memory controller 30 is generally tasked with facilitating the execution of the requests to the memory devices and coordinating the exchange of information, including configuration information, to and from the memory devices.

The memory sub-system may include a plurality of slots 32-46. Each slot 32-46 is configured to operably couple a memory module, such as a dual-inline memory module ("DIMM"), to the memory controller 30 via one or more memory buses. Each DIMM generally includes a plurality of memory devices such as DRAM devices capable of storing data, as described further below with reference to FIG. 3. As described further below, each DIMM has a number of memory devices on each side of the module. Each side of the module may be referred to as a "rank." Accordingly, each exemplary slot 32-46 is configured to receive a single DIMM having two ranks. For instance, the slot 32 is configured to receive a DIMM having ranks 32A and 32B, the slot 34 is configured to receive a DIMM having ranks 34A and 34B, and so forth. In the present exemplary embodiment, each of the eight memory slots 32-46 is capable of supporting a module comprising eight individual memory devices on each rank 32A/B-46A/B, as best illustrated with respect to FIG. 3, described further below.

Referring again to FIG. 2, the memory buses may include a memory data bus 48 to facilitate the exchange of data between each memory device on the DIMMs and the memory controller 30. The memory data bus 48 comprises a plurality of single bit data buses, or transmission lines, each coupled from the memory controller 30 to a memory device. In one embodiment of the volatile memory 26, the memory data bus 48 may include 64 individual data buses. Further, the memory data bus 48 may include one or more individual buses to each memory rank 32A/B-46A/B which may be used for ECC error detection and correction. As can be appreciated by those skilled in the art, the individual buses of the memory data bus 48 will vary depending on the configuration and capabilities of the system 10.

The volatile memory 26 also includes a command bus 50 on which address information such as command address (CA), row address select (RAS#), column address select (CAS#), write enable (WE#), bank address (BA), chip select (CS#), clock enable (CKE), and on-die termination (ODT), for example, may be delivered for a corresponding request. Further, the command bus 50 may also be used to facilitate the exchange of configuration information at boot-up. As with the memory data bus 48, the command bus 50 may comprise a plurality of individual command buses. In the present embodiment, the command bus 50 may include 20 individual buses. As previously described with reference to the memory data bus 48, a variety of embodiments may be implemented for the command bus 50 depending on the system configuration.

Figure 3:
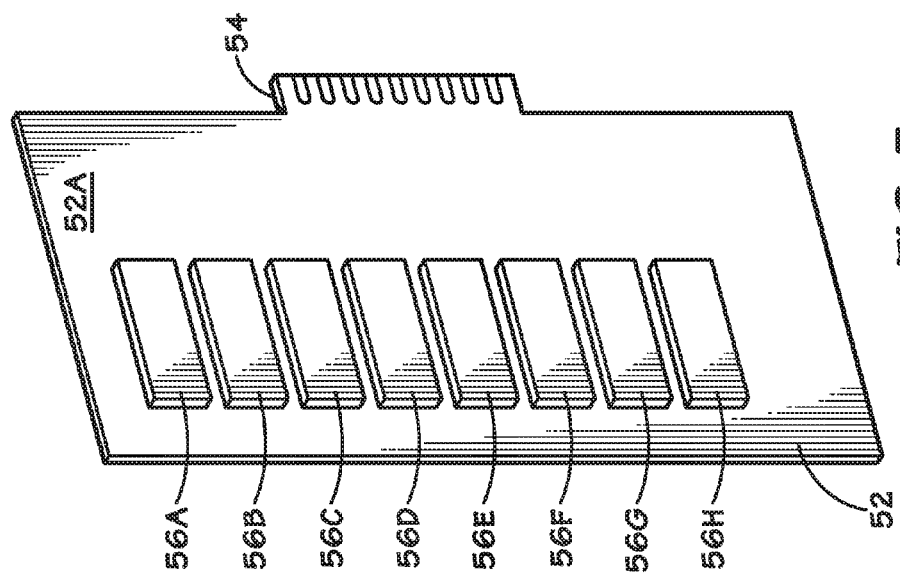
FIG. 3 illustrates a memory module in accordance with an embodiment of the present technique.

FIG. 3 illustrates one embodiment of a memory module 52, such as a DIMM, that may be inserted into one of the memory slots 32-46 (FIG. 2). In the present exemplary view, one side of the memory module 52 is illustrated, and generally designated as the rank 52A. As previously discussed, the memory module 52 may include two ranks 52A and 52B. The rank 52A includes a plurality of memory devices 56A-56H, such as dynamic random access memory (DRAM) devices, which may be used for storing information. As will be appreciated, the second opposing side of the memory module 52 (52B, not shown) also includes a number of memory devices. The memory module 52 may include an edge connector 54 to facilitate mechanical coupling of the memory module 52 into one of the memory slots 32-46. Further, the edge connector 54 provides a mechanism for electrical coupling to facilitate the exchange of data and control signals from the memory controller 30 to the memory devices 56A-56H (and the memory devices on the second ranks). The embodiment of FIG. 3 may be employed in accordance with various standards. For instance, the memory module 52 may be employed in a single data rate (SDR), fully buffered (FB)-DIMM, double data rate (DDR), and double data rate 2 (DDR2) system 10.

The memory devices 56A-56H may each include an array of cells (not shown) that each include a transistor and a capacitor or some other memory element. In certain embodiments, at least a portion of the cells may be manufactured in accordance with embodiments of the present techniques. For example, one or more cells may include a fin FET and a memory element, such as a capacitor.

Figure 4:
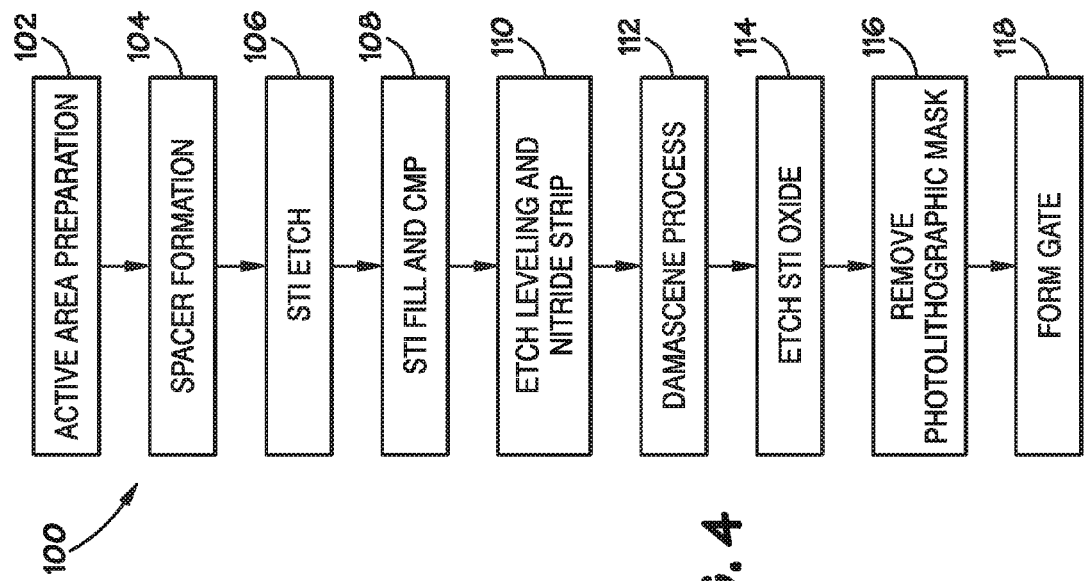
FIG. 4 illustrates a flow chart depicting a manufacturing process in accordance with an embodiment of the present technique.
Figure 5:
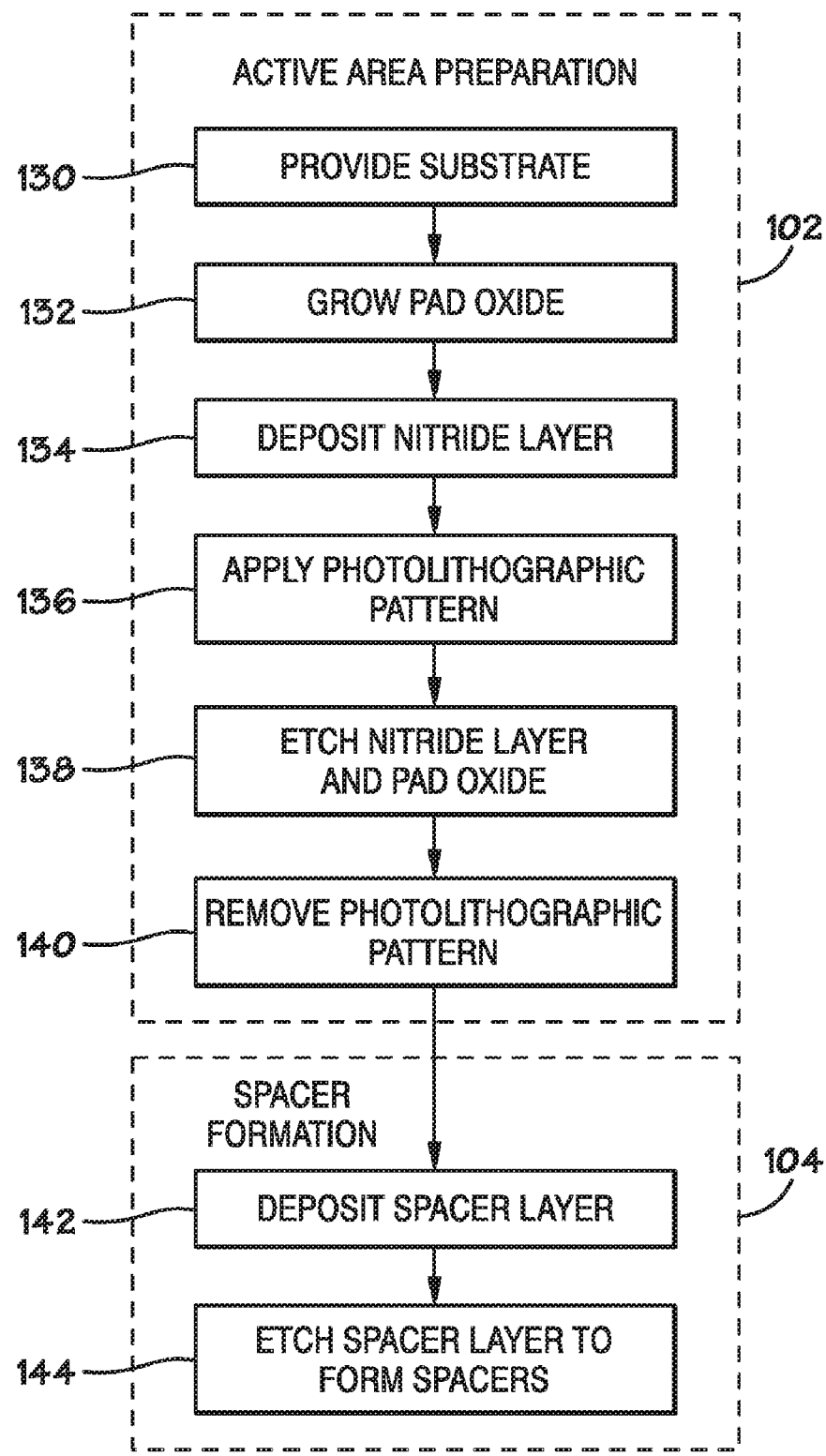
FIG. 5 illustrates a flow chart depicting a technique for active area preparation and spacer formation in accordance with an embodiment of the present technique.

Accordingly, FIG. 4 is a flowchart illustrating one embodiment of a manufacturing process 100 that may be used to manufacture a fin FET in accordance with embodiments of the present technique. As illustrated in FIG. 4, the exemplary manufacturing process 100 may begin with active area preparation and spacer formation, as indicated by blocks 102 and 104 of FIG. 4. As described above, FIG. 4 is a flowchart illustrating an overview of one embodiment of a manufacturing process. FIG. 5 is a flowchart illustrating additional detail relating to blocks 102 and 104 from FIG. 4 which will be described initially below. In addition, blocks 102 and 104 of FIG. 5 are also be described in combination with FIGS. 6A, 6B, and 7, which depict perspective view of a semiconductor structure during the manufacturing process described in relation to FIGS. 4 and 5.

Figure 6A:
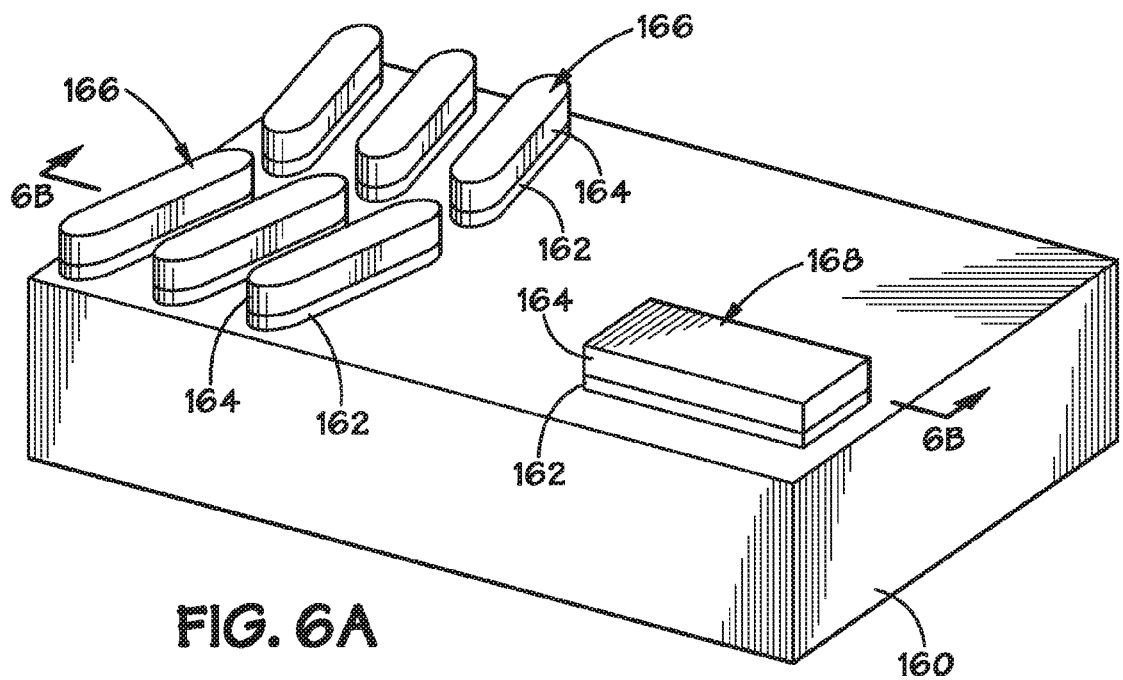
Figure 6B:
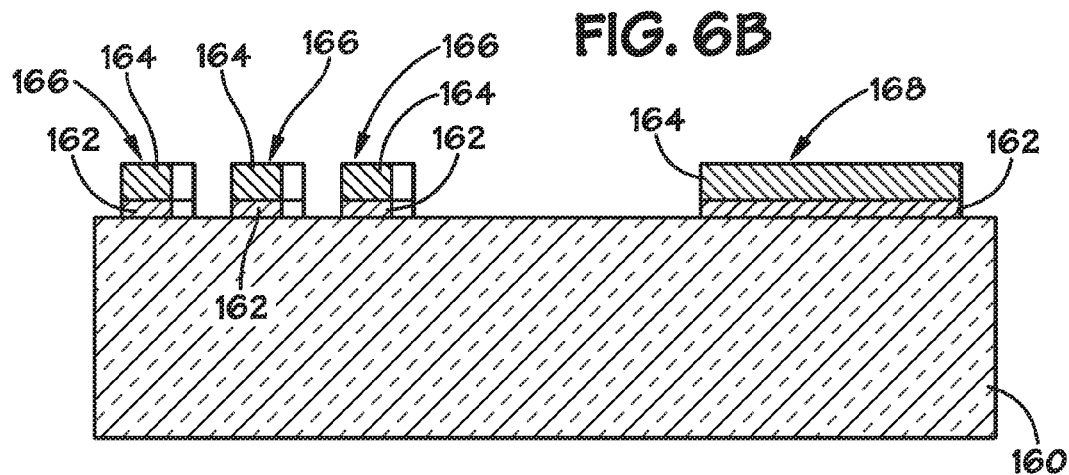
Figure 7:
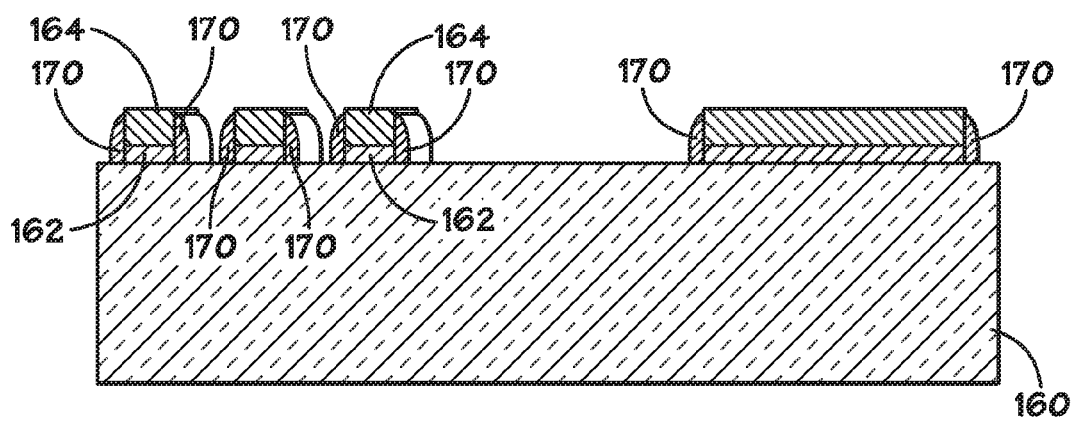

Accordingly, as indicated by block 130 of FIG. 5 and illustrated in FIGS. 6A and 6B, active area preparation may begin by providing the substrate 160. As will be appreciated, the substrate 160 may form the foundation of a semiconductor structure. The substrate 160 may include semiconductive materials such as single crystalline or poly crystalline silicon, gallium arsenide, indium phosphide, or other materials with semiconductor properties. Alternately or additionally, the substrate 160 may include a non-semiconductor surface on which an electronic device may be constructed such as a plastic or ceramic work surface, for example. The substrate 160 may be in the form of a whole wafer, a portion of a diced wafer, or a portion of a diced wafer in a packaged electronic device, for instance.

The technique for active area preparation 102 may then continue with growing and/or otherwise creating a pad oxide layer ("PADOX") 162 on top of and/or adjacent to the substrate 160, as indicated by block 132. As those of ordinary skill in the art will appreciate, the PADOX 162 typically includes a thin, thermally grown oxide that is employed to separate adjacent layers during fabrication of a semiconductor. In one embodiment, the PADOX 162 will be approximately 50 angstroms ("A") thick.

Next, the technique for active area preparation 102 may include depositing a nitride layer 164 on top of and/or adjacent to the PADOX 162, as indicated by block 134. In one embodiment, the nitride layer 164 may include a layer of silicon nitride with a thickness between approximately 500 and 700 A. However, in other embodiments, other suitable types of nitrides and/or other suitable layer thicknesses may be employed in the technique 102. For example, in one embodiment, the nitride layer 164 may include a 100 A-200 A thick section of additional nitride that is deposited to account for the STI etch described below. For the purposes of the present application, it will be appreciated that a "deposited" layer should be construed as being placed above but not necessarily resting on an underlying layer (i.e., there may be intervening layers between the deposited layer and the underlying layer); whereas a layer "deposited directly on top of" an underlying should be construed as resting directly on top of the underlying layer.

Next, the technique 102 may include applying a photolithographic mask (not shown in FIG. 6A, 6B, or 7) on top of and/or adjacent to the nitride layer 164, as indicated by block 136. In one embodiment, the photolithographic mask may define a plurality of walls 166, the formation of which are described further below. In one embodiment, a photolithographic mask may define the walls 166 with a width of approximately 200 or less and a length of approximately 1500 or more. After the photolithographic mask has been applied, the technique 102 may involve etching the nitride layer 164 and the PADOX 162 to form the walls 166, as indicated by block 138. In one embodiment, etching the nitride layer and the PADOX 162 may include performing an insitu etch, such as active ion etching or other suitable form of anisotropic etch. Alternatively, other suitable forms of wet and dry etching may be employed. Additionally, in some embodiments, the technique 102 may also include etching through some portion of the substrate 160 in conjunction with etching the nitride layer 164 and the PADOX 162. For example, in one embodiment, the technique 102 may include etching approximately 200 A from the substrate 160 in the areas that are not below the walls 166. After the etching has been completed, the technique 102 may include removing the photolithography mask, as indicated by block 140. One embodiment of the semiconductor structure formed after block 140 is illustrated in FIG. 6.

Turning next to the spacer formation technique 104, this technique may begin by depositing a spacer layer on top and/or adjacent to the nitride layer 164 and the substrate 160, as indicated by block 142. In one embodiment, depositing the spacer layer may include depositing a layer of Tetraethyl Orthosilicate ("TEOS") at a thickness of approximately 300 A. This TEOS layer may be deposited using an Atomic Layer Chemical Deposition. However, in other embodiments, alternate processes may be employed to deposit the TEOS layer. For example, in other embodiments, a Plasma Enhanced Chemical Vapor Deposition or other suitable Chemical Vapor Deposition process may be employed. Moreover, in still other embodiments, other suitable spacer materials and/or layer thicknesses may be employed in the technique 104. After depositing the spacer layer, the technique 104 may involve etching the spacer layer to form spacer 170, as indicated by block 144 and illustrated in FIG. 7. In various embodiments, etching the spacer layer may include performing a stop on silicon etch, performing an insitu TEOS silicon etch, or performing another suitable type of etch.

Figure 8:
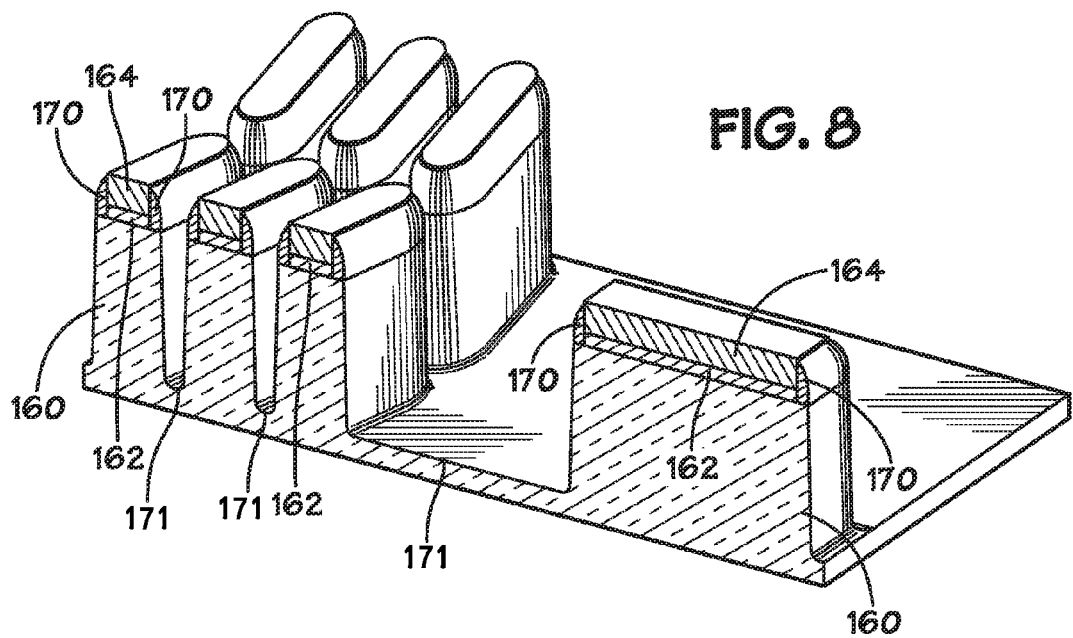

Returning to FIG. 4 in conjunction with FIG. 8, after the spacers 170 have been formed, the technique 100 may proceed with a shallow trench isolation ("STI") etch, as indicated by block 106. In one embodiment, the STI etch may include etching approximately 2,000 to 3,000 A into the substrate 160 to create one or more trenches 171. However, in alternate embodiments the STI etch may include etching to another suitable depth into the substrate 160. As will be appreciated, during the STI etch, the nitride layer 164 and the spacer 170 may function as the hard mask to protect those areas of the substrate 160 covered by the nitride layer 164 and the spacer 170 from the STI etching. FIG. 8 illustrates one embodiments of a semiconductor structure after the completion of the STI etch. In addition, although the STI etch (block 106) and the spacer layer etch (block 144) are illustrated in FIGS. 4 and 5 as two separate blocks, in one embodiment, these two etches may be performed together.

Figure 9:
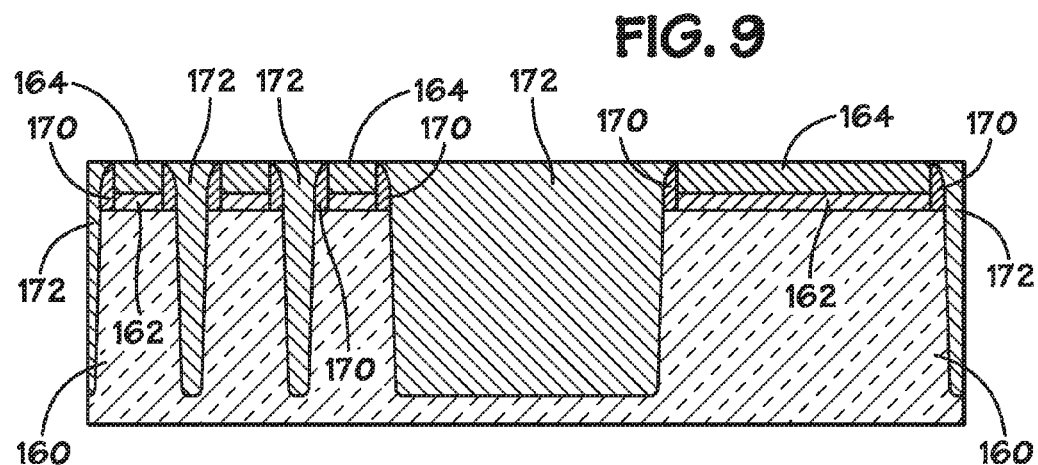

Next, the technique 100 may include performing an STI fill and chemical mechanical polish ("CMP") on the semiconductor structure, as indicated by block 108 of FIG. 4 and illustrated in the structure of FIG. 9. In one embodiment, the STI fill may include filling the areas etched out by the STI etch with a spin on dielectric ("SOD") 172 (See FIG. 9). In other embodiments, however, other suitable types of dielectric may be used to fill the areas removed by the STI etch 106. As also indicated by block 108, after the SOD fill has been applied, the technique 100 may also include performing a CMP on the semiconductor structure. In one embodiment, the CMP may include a stop on nitride ("SON") CMP that will polish the SOD fill 172 until the top of the SOD fill 172 is roughly flush with the top of the nitride layer 164. In other words, the top of the semiconductor structure may be polished until the polisher in the CMP device reaches the nitride layer 164. FIG. 9 illustrates one embodiment of a semiconductor structure following the STI fill and CMP.

Figure 10:
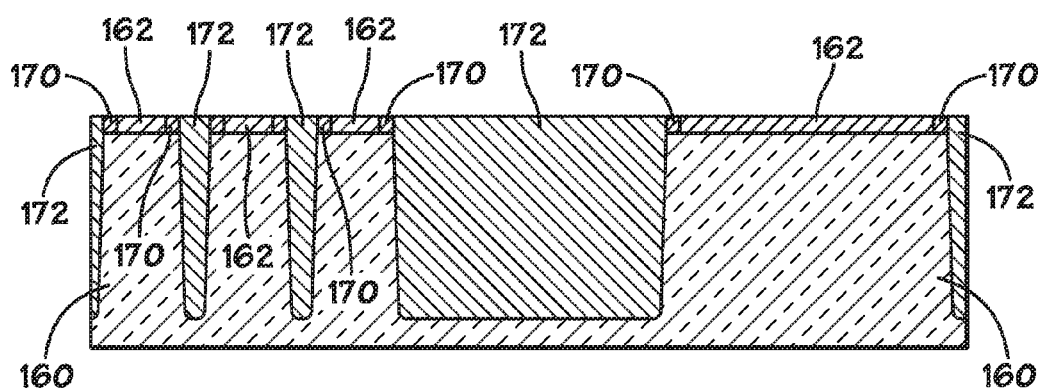

Next, the technique 100 may include etch leveling and a nitride strip, as indicated by block 110. In one embodiment, etch leveling may include a buffer oxide etch using a mixture of ammonia, fluoride, and hydrofluoric acid. In alternate embodiments, however, other suitable types of etch leveling may be employed. Similarly, in one embodiment, the nitride strip illustrated in block 110 may include a wet nitride strip employing boiling phosphoric acid, but in alternate embodiments, other suitable types of wet nitride strip may be employed in the technique 100. FIG. 10 illustrates an exemplary semiconductor structure following the etch leveling and nitride strip (block 110). As illustrated, the etch leveling and nitride strip removed the nitride layer 164 and removed the section of the spacers 170 that was roughly adjacent to the nitride layer 164. It should be noted, however, that the bottom part of the spacers 170 adjacent to the PADOX 162 was not removed by the nitride strip.

Figure 11A:
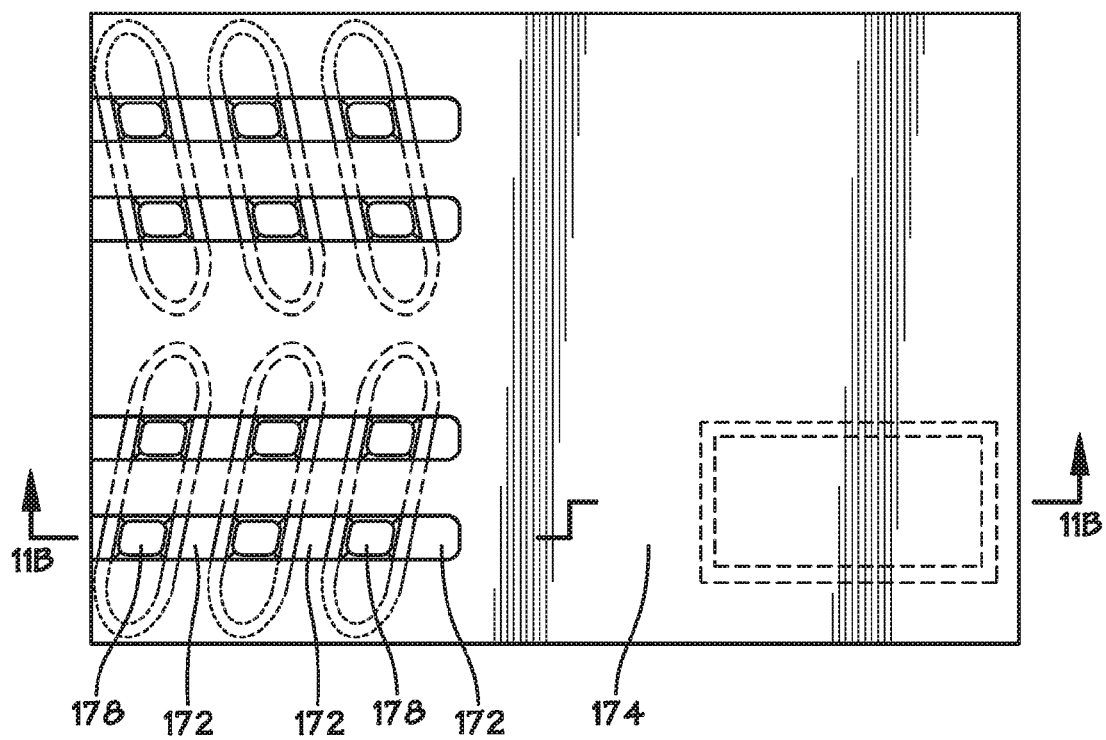
Figure 11B:
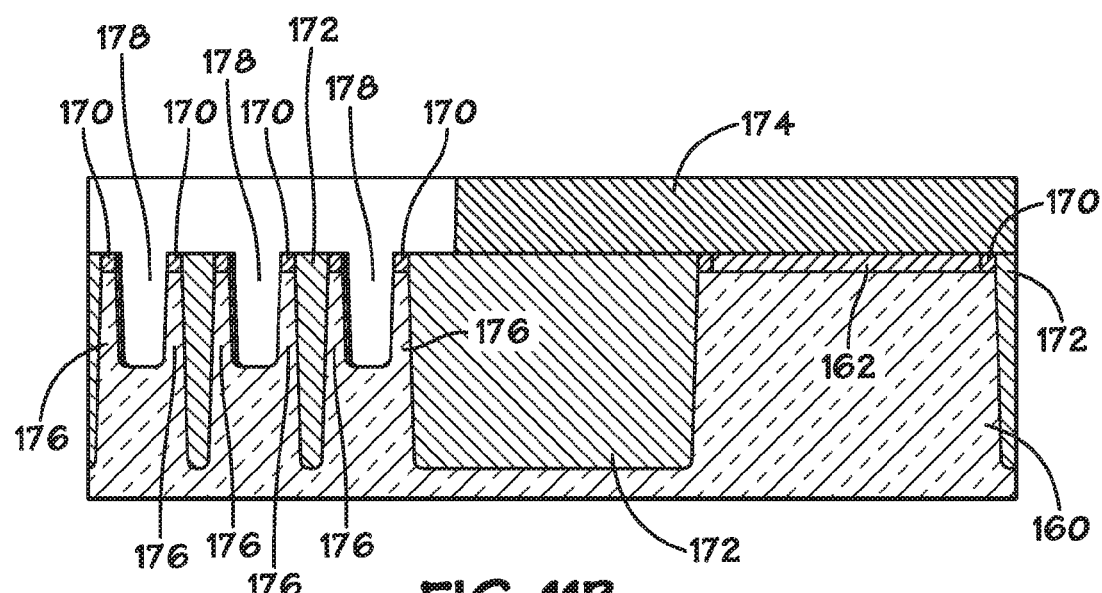

After the etch leveling and nitride strip (block 110), the technique 100 may include a damascene process, as indicated by block 112. In one embodiment, the damascene process may include applying a photolithographic mask 174 to cover the parts of the semiconductor structure that will not ultimately be a part of the fin (see FIGS. 11A, 11B, and 12), such as the area of the semiconductor structure that will become contact pads for either the source and/or drain of the semiconductor. The damascene process may also include performing an oxide etch (e.g., an oxide punch) to remove the PADOX 162 (where it is not protected by the mask 174), and then performing a silicon etch to create one side of fins 176. For example, as illustrated by FIGS. 11A and 11B, the spacers 170 and the SOD fill 172, each of which is substantially unaffected by the silicon etch, will function as a mask during the silicon etch part of the damascene process. This results in channels 178 that form one wall of each of the fins 176. The depth of the channels 178 (i.e., the depth of the silicon etch) may be adjusted to vary the height of the fins 176. In various embodiments, the height of the fins 176 may vary between 500 A and 2,000 A with higher fins exhibiting better isolation between memory cells.

Next, with the photolithographic mask 174 still in place, the technique 100 may include performing an STI oxide etch to remove the remaining part of the spacer 170 and remove the SOD fill 172 to a depth, as indicated by block 114. Typically, the depth of the STI oxide etch will be roughly approximate to the depth of the channels 178. For example, FIG. 12 illustrates an exemplary semiconductor structure after the STI oxide etch removed the spacers 170 and the SOD fill 172 to the same approximate depth as the channels 178. As illustrated in FIG. 12, in one exemplary embodiment, the STI oxide etch creates one or more double fins 176 (i.e., two fins) extending up from the substrate 160. As shown in FIG. 12, each of the fins 176 in the double fin extends upward from an outcropping 181 of substrate that extends upward from the substrate 160 and is partially separated by the SOD 172 from other outcroppings 181 from the substrate 160. Similarly, each of the fins 176 within a double fin pair, while formed from the substrate 160, may extend upward from one of the outcroppings and be partially separated from the other fin 176 in the double fin by the channel 178.

Figure 14A:
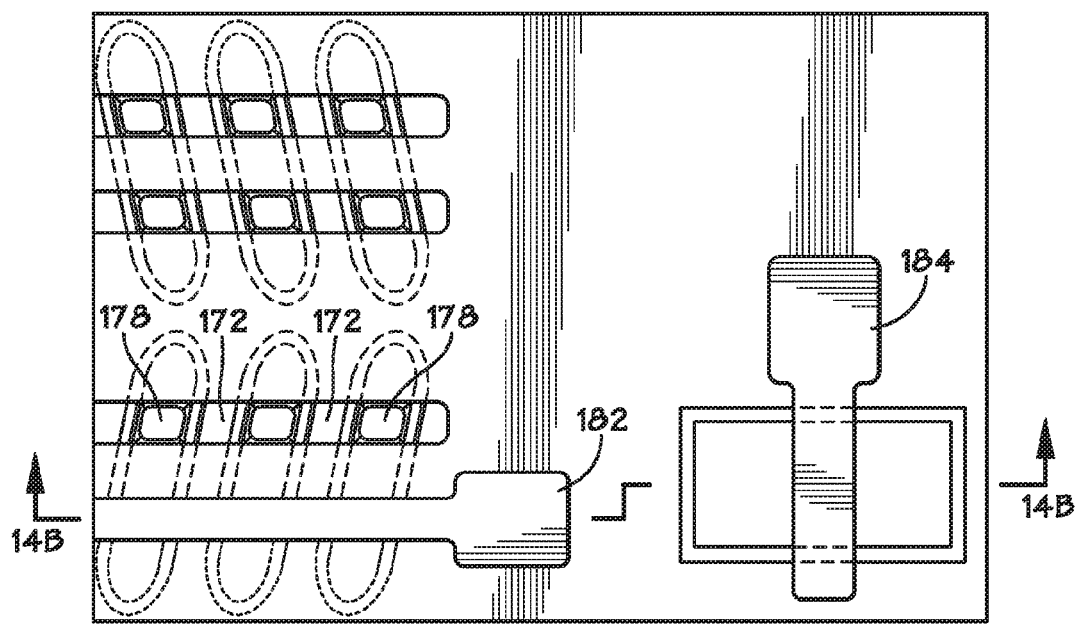
Figure 14B:
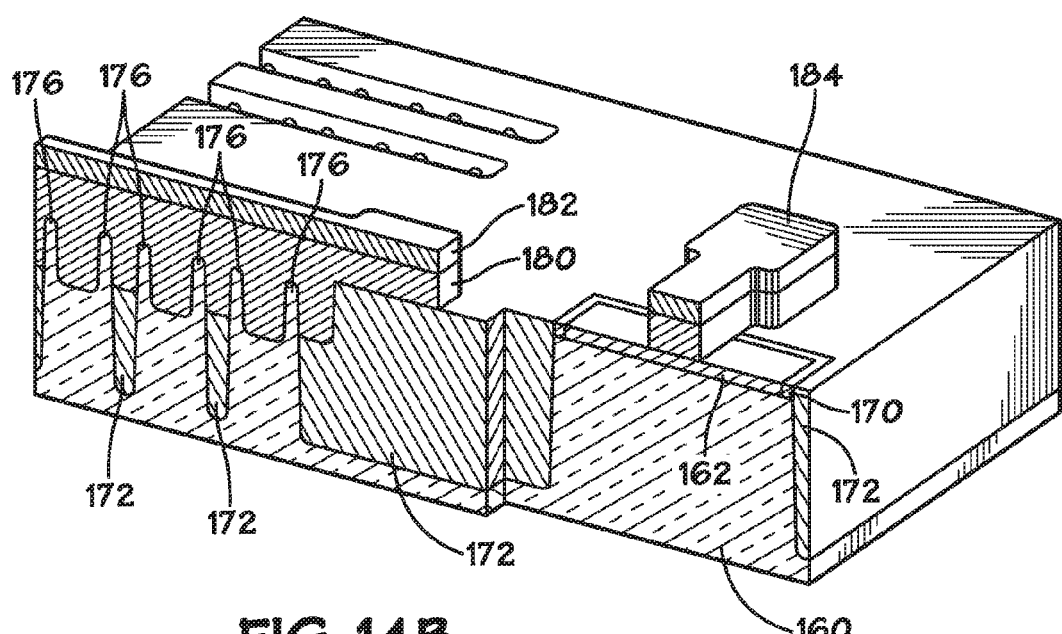

Next, the photolithographic mask 174 may be removed, as indicated by block 116 of FIG. 4 and illustrated in FIG. 13. Lastly, a gate may be formed as indicated by block 118 and depicted in FIGS. 14A and 14B. In one embodiment, forming the gate may include depositing silicon and/or polysilicon 180 between and/or around the fins 176. Because the fins 176 are recessed below the original surface of the substrate 160, slight misalignments between the gate 180 and the fins 176 will not substantially affect operation of the fin FET. As described above, in one embodiment, the gate 180 is deposited after the fins 176 have been fully formed. Lastly, as also illustrated in FIGS. 14A and 14B, a layer of tungsten silicide 182 or other suitable material may be deposited on top of and/or adjacent to the gate 180 to act as a landing pad for context for the fin FET. Moreover, additional contacts 184 for a source and/or drain for the FINFET may also be formed during block 118 of FIG. 4.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A structure comprising:
    a substrate having a trench formed therein;
    a first outcropping from the substrate partially defined by a first side of the trench, wherein the first outcropping comprises first fins separated by a first channel;
    a second outcropping from the substrate partially defined by a second side of the trench, wherein the second outcropping comprises second fins separated by a second channel, wherein the upper surfaces of the first outcropping and the second outcropping are recessed below the upper surface of the substrate;
    first spacers formed on upper surfaces of the first fins; and
    second spacers formed on upper surfaces of the second fins, wherein the first spacers and the second spacers are configured to mask the first fins and the second fins during an etching process.

2. The structure, as set forth in claim 1, wherein the first spacers and the second spacers comprise Tetraethyl Orthosilicate Silicone.

3. The structure, as set forth in claim 1, wherein the first outcropping comprises a first double fin field effect transistor, and wherein the second outcropping comprises a second double fin field effect transistor.

4. A structure comprising:
a substrate having an upper surface and thickness;
a plurality of double fin structures formed below the upper surface and within the thickness of the substrate; and
a plurality of trenches formed in the substrate, wherein each of the plurality of trenches is formed between two of the plurality of double fin structures.

5. The structure, as set forth in claim 4, wherein each of the plurality of trenches comprises a depth in the range of approximately 2,000-3,000 Angstroms.

6. The structure, as set forth in claim 4, wherein each of the double fin structures comprises a first fin, a second fin and a channel formed therebetween.

7. The structure, as set forth in claim 6, where the channel comprises a depth in the range of approximately 500-2,000 Angstroms.

8. The structure, as set forth in claim 6, wherein each of the plurality of trenches is partially filled with a dielectric material.

9. The structure, as set forth in claim 8, wherein the dielectric material partially fills each of the plurality of trenches to a height that is approximately equal to a depth of the channel.

10. The structure, as set forth in claim 8, comprising a gate material on top of the dielectric material to completely fill the trenches.

11. The structure, as set forth in claim 10, wherein the gate material is disposed to fill the channel and disposed on the upper surface of the substrate.

12. The structure, as set forth in claim 11, comprising a contact material disposed on the gate material.

* * * * *